United States Patent [19]

Ogita

[11] 4,035,585
[45] July 12, 1977

[54] DEMODULATOR CIRCUIT IN MULTIPLEX STEREO AND MONOPHONIC RECEIVER

[75] Inventor: Minoru Ogita, Hamamatsu, Japan

[73] Assignee: Nippon Gakki Seizo Kabushiki Kaisha, Hamamatsu, Japan

[21] Appl. No.: 664,942

[22] Filed: Mar. 8, 1976

Related U.S. Application Data

[63] Continuation-in-part of Ser. No. 294,174, Oct. 2, 1972.

[30] Foreign Application Priority Data

Sept. 30, 1971 Japan .................... 46-76530
Sept. 30, 1972 Germany ................ 2248176

[51] Int. Cl.$^2$ .................................. H04H 5/00
[52] U.S. Cl. .................................. 179/15 BT
[58] Field of Search ........... 179/15 BT; 329/136, 329/173, 168, 178; 325/36

[56] References Cited

U.S. PATENT DOCUMENTS

| | | |
|---|---|---|
| 3,301,959 | 1/1967 | Jenkins .................... 179/15 BT |
| 3,662,113 | 5/1972 | von Recklinghausen ...... 179/15 BT |
| Re. 28,617 | 11/1975 | McShan .................... 179/15 BT |

OTHER PUBLICATIONS

Electronic Circuits by E. J. Angelo, McGraw-Hill, 1958, p. 598.

Primary Examiner—Douglas W. Olms
Attorney, Agent, or Firm—Cushman, Darby & Cushman

[57] ABSTRACT

An FM multiplex receiver comprises an averaging detection type demodulator circuitry. Two negative feedback paths lead from the L and R outputs of the switching circuit to the input of the amplifier, the output of which is connected to the input of the switching circuit. Output signals from the switching circuit are time-shared alternative ones in the stereophonic reception and continuous ones in the monophonic reception. The amplification factor observed during monophonic reception is substantially one half of that observed during stereophonic reception. With a very simple circuitry, the occurrence of undesired difference in sound levels is prevented between the monophonic listening and the stereophonic listening.

7 Claims, 6 Drawing Figures

FIG. 5
FIG. 6
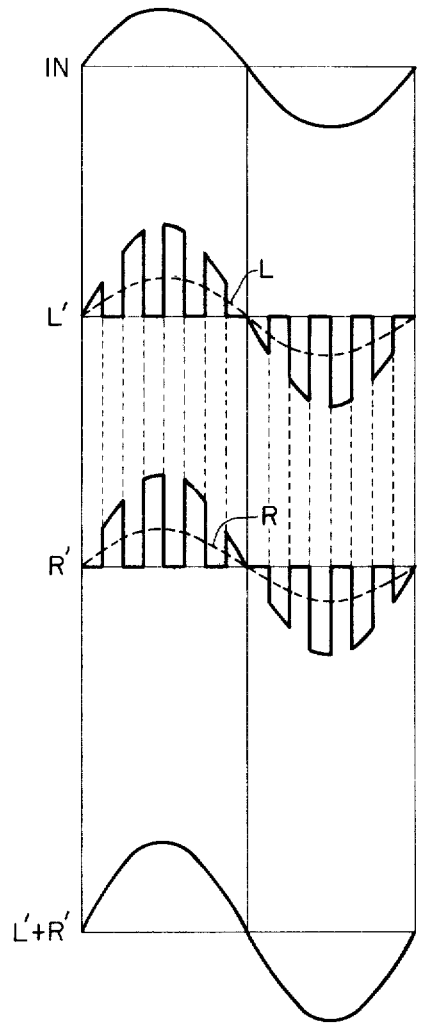
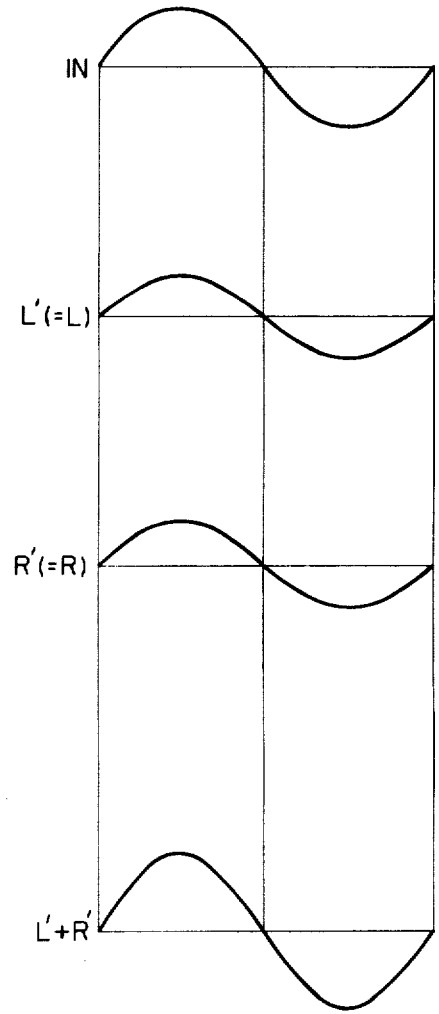

DEMODULATOR CIRCUIT IN MULTIPLEX STEREO AND MONOPHONIC RECEIVER

CROSS-REFERENCE TO RELATED APPLICATIONS

This application is a continuation-in-part application of Ser. No. 294,174 filed Oct. 2, 1972 which is relied upon and incorporated by reference.

BACKGROUND OF THE INVENTION a. Field of the Invention

This invention relates generally to multiplex stereophonic receivers, and more particularly it is directed to an improvement in an averaging demodulator circuitry of a receiver designed specifically for the reception of both multiplex stereophonic and monophonic programs in the frequency modulation, i.e. FM broadcast band.

b. Description of Prior Art

It is well known that, for reception of multiplex stereophonic broadcast program by these types of receivers, and incoming stereophonic composite signal must be separated into an audio signal representing a left hand channel (hereinafter referred to as the "L signal") and another audio signal representing a right hand channel (hereinafter referred to as the "R signal"), the L and R signals being stereophonically related with each other. Heretofore, there have been known two schemes for converting the stereophonic composite signal into the separate L and R signals, one using a matrix circuit and the other using a switching circuit. For reasons of relative simplicity in construction and a higher degree of separation obtained, the latter scheme is now generally preferred. However, according to known circuit arrangements based on this latter scheme, which usually incorporate diodes or transistors, distortion occurs inevitably as a result of the switching operation; and moreover, the output levels of their de-emphasis filters during the stereophonic reception are usually about 6 decibels lower than those levels observed during the monophonic reception.

Also known, as disclosed in, for example, U.S. Pat. No. 3,301,959 to R. Jenkins, is a circuit arrangement comprising: a switching demodulator provided posteriorly to a single power amplifier in order to omit one more power amplifier which ordinarily is required to perform power-amplication of both the L-channel and R-channel audio signals assigned to drive the speakers; capacitors provided on the output lines of the switching demodulator for sample-holding the chopped outputs delivered from the demodulator and thereby producing envelope-detected continuous audio signals; speakers for converting the resulting audio signals into sounds; and negative feedback paths for feeding the continuous audio signals back to the power amplifier to stabilize the operation of this power amplifier. However, the audio sounds through envelope detection lack high fidelity to the original input signals.

SUMMARY OF THE INVENTION

Accordingly, it is a primary object of the present invention to provide a novel and improved averaging demodulator circuitry for a receiver designed for the reception of both multiplex stereophonic and monophonic programs in the FM broadcast band, such that its left and right output levels during the monophonic reception are both automatically rendered equal to the left and right output levels observed during the stereophonic reception.

Another object of the present invention is to provide a demodulator circuitry of the type described above, which minimizes distortions resulting from the switching operation carried out to convert a composite signal into the separate L and R signals.

A further object of the present invention is to provide a demodulator circuitry of the type described above, which is of a simple and inexpensive arrangement.

The novel features which are considered as being characteristic of the present invention are set forth in particular in the appended claims. The present invention itself, however, together with the additional objects and advantages thereof, will become more apparent and understandable as the description proceeds, with reference made to the accompanying drawings wherein like reference characters designate like parts throughout the several diagrams.

BRIEF DESCRIPTION OF THE DRAWINGS

FIG. 5 is an illustration of certain waveforms produced at various parts of the demodulator circuitry of FIGS. 3 and 4 at the time of receiving a stereophonic signal.

FIG. 6 is an illustration of certain waveforms produced at various parts of the demodulator circuitry of FIGS. 3 and 4 at the time of receiving a monophonic signal.

DETAILED DESCRIPTION OF THE PREFERRED EMBODIMENTS

In order to make clear the advantages and features of the present invention, it is considered essential that some prior art techniques of this field of art be shown.

Figure 1:
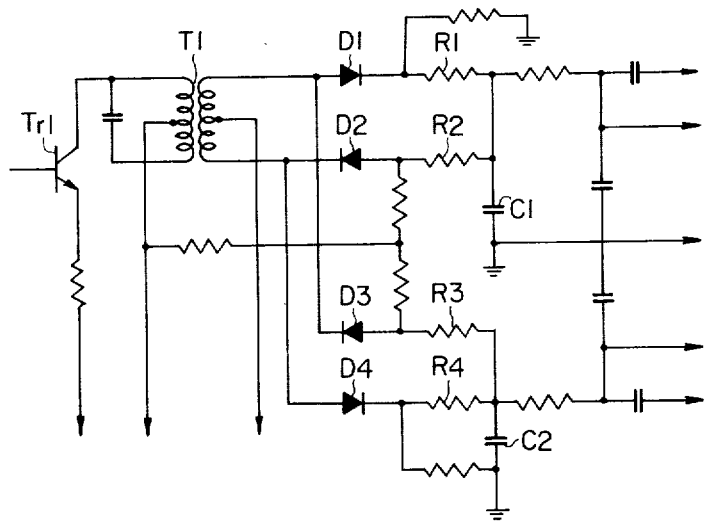
FIG. 1 is an electrical circuit diagram of a prior art envelope demodulator circuitry of a multiplex stereophonic and monophonic receiver.

Referring now to FIG. 1 which illustrates a known circuit arrangement designed for equalizing the left and right output levels during the reception of a monophonic broadcasting to the left and right output levels observed during the reception of a stereophonic broadcasting, there is provided a transistor Tr1 to amplify a 38 kHz subcarrier derived from the incoming stereophonic composite signal. This transistor Tr1 is connected to the primary of a tank circuit T1, the secondary of which in turn is connected to switching diodes D1 to D4. These diodes are connected via resistors R1 to R4 to integrating capacitors C1 and C2 which sample and hold switched outputs. Thus, a demodulator circuitry of the envelope-detection type is constituted. The use of such integrating capacitors, however, gives rise to distortion of the audio waveform, resulting in deteriorated frequency characteristics in a higher frequency range.

Figure 2:
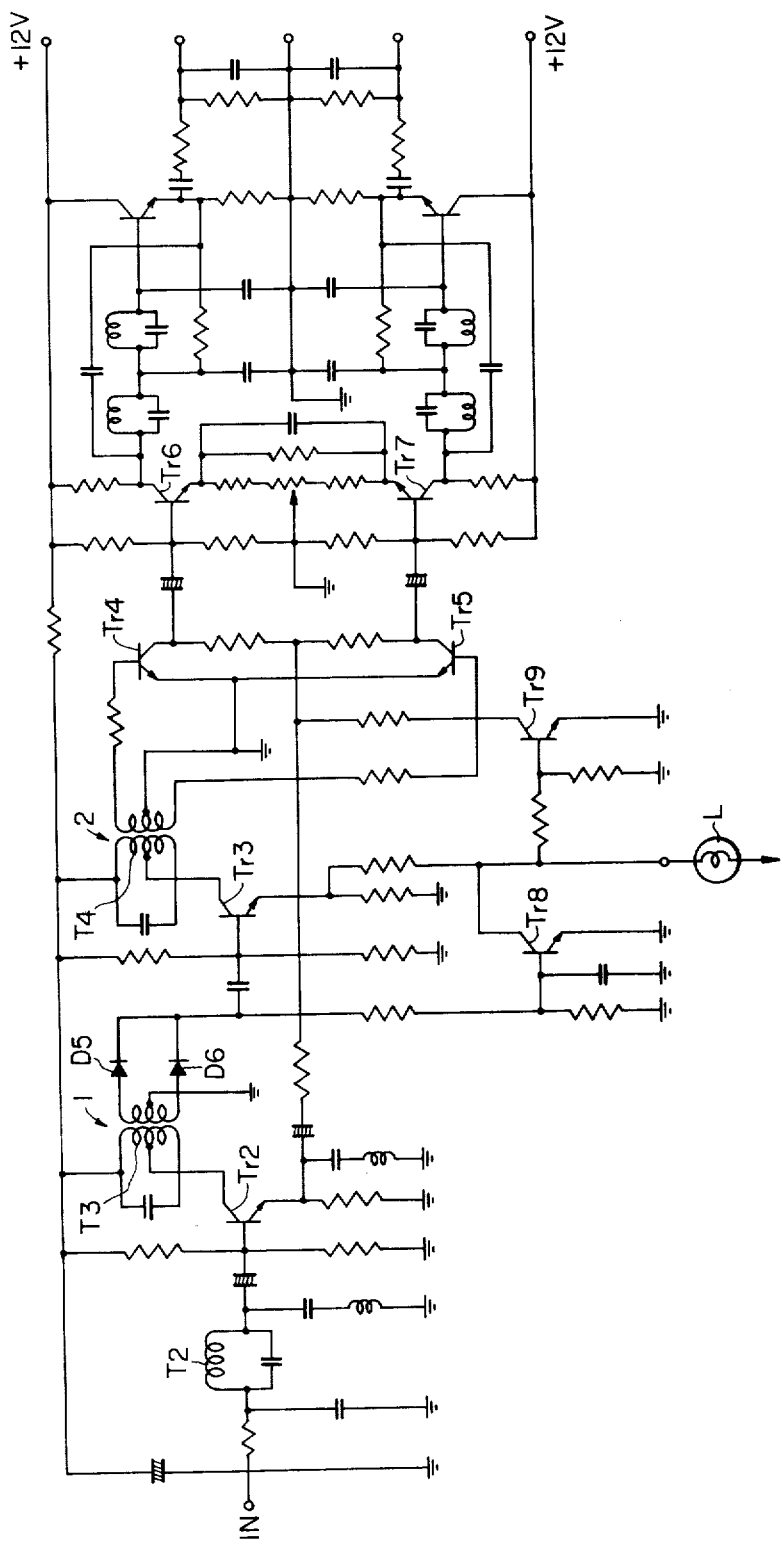
FIG. 2 is an electrical circuit diagram of a prior art averaging demodulator circuitry of a multiplex stereophonic and monophonic receiver.

Another circuit arrangement used conventionally for the same purpose is illustrated in FIG. 2, in which the stereophonic composite signal received through an input terminal IN has its SCA signal content removed at a tank circuit T2 and the resulting composite is then applied to the base of a transistor Tr2. The pilot signal of 19 kHz which is also contained in the incoming stereophonic composite signal is applied from its collector to a tank circuit T3. A pair of diodes D5 and D6 are connected to the secondary of a coupling transformer 1 of the tank circuit T3 in order to double the frequency of the pilot signal, so that there is obtained a subcarrier of 38 kHz.

This 38 kHz subcarrier is amplified at a transistor Tr3 and, via a tank circuit T4 which is connected to the collector of the transistor Tr3, is applied to the bases of switching transistors Tr4 and Tr5 which are connected to both extremities of the secondary of a coupling transformer 2 of the tank circuit T4. Accordingly, these two transistors Tr4 and Tr5 are alternately switched on and off by the 38 kHz subcarrier for each half-cycle thereof.

The aforesaid stereophonic composite signal is fed from the emitter of the transistor Tr2 to the collectors of the switching transistors Tr4 and Tr5 and, by virtue of the on-off operation of these switching transistors, the signal is separated into the L and R signals, which signals are then applied to transistors Tr6 and Tr7 making up an amplifier. Thus, a demodulator circuitry of the averaging-detection type is constituted.

Further, with reference to FIG. 2, during the presence of the aforesaid subcarrier, that is, so long as the 19 kHz pilot signal for the stereophonic broadcast is contained in the incoming composite signal, the 38 kHz subcarrier produced therefrom by the frequency double which is composed of the coupling transformer 1 and the diodes D5 and D6 is also supplied to a transistor Tr8 to light up a lamp LP connected to its collector, the lamp thereby indicating the reception of the stereophonic broadcast.

The collector of the transistor Tr8 is further connected to the base of an additional transistor Tr9, the collector of this latter transistor being connected to the collectors of the switching transistors Tr4 and Tr5 via resistors. Hence, the transistor Tr9 is maintained non-conductive during the conduction of the transistor Tr8. Conduction takes place through the transistor Tr9 only during the reception of the monophonic broadcast, in order to lower the output levels of the collectors of the switching transistors Tr4 and Tr5 and thus to make them agree with the output levels during the reception of the stereophonic broadcast.

While this prior art circuit arrangement of FIG. 2 produces less distortion of audio waveforms and reproduces the transmitted sound with a higher fidelity, as compared with the circuit arrangement of FIG. 1 incorporating the integrating capacitors, it is, nevertheless, impossible to reduce the audio waveform distortion almost completely in this known manner. Moreover, the provision of the additional transistor Tr9 makes the whole circuitry unnecessarily complex and expensive.

Figure 3:
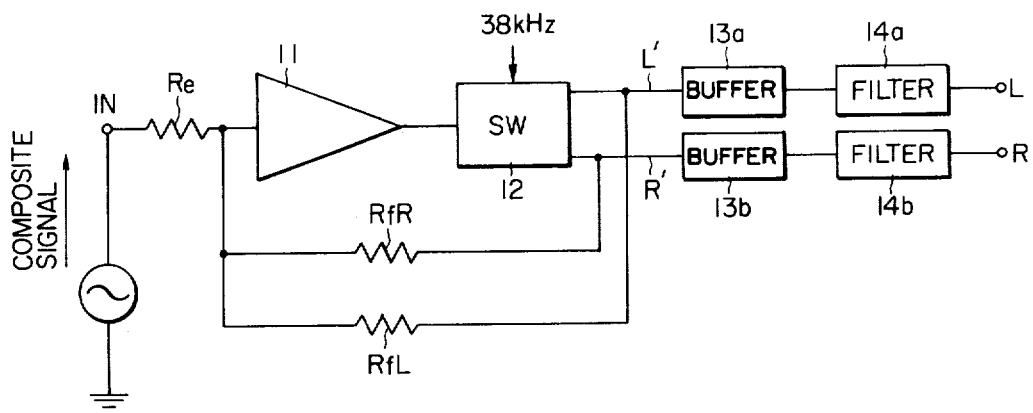
FIG. 3 a block diagram showing the general principle of the averaging demodulator circiutry of the present invention.

A preferred embodiment of the present invention, free from the above-mentioned difficulties of the prior art, will hereunder be described with particular reference to the block diagram of FIG. 3. The stereophonic composite signal which is representative of a stereophonic broadcast program is fed into a voltage amplifier circuit 11 of a high gain such as 40dB via the input terminal IN. This amplifier circuit 11 is associated with: a frequency doubler for converting the 19 kHz pilot signal contained in the incoming stereophonic composite signal into a 38 kHz subcarrier; an SCA trap for filtering out the 67 kHz SCA signal also contained in this composite signal; and a circuit including a lamp to be lit up for indicating the reception of the stereophonic broadcast.

The output of the voltage amplifier circuit 11 is connected to a switching circuit 12, to which is supplied the 38 kHz subcarrier obtained as stated above. For each half-cycle of this subcarrier, the switching circuit 12 is alternately turned on and off to separate the stereophonic composite signal fed from the voltage amplifier circuit 11 into the resulting time-shared L' and R' signals. The L' and R' signals are then fed into non-capacitive (pure resistive) buffer circuits 13a and 13b, respectively. The outputs of these buffer circuits 13a and 13b are fed to filters 14a and 14b which serve to filter out both the 19 kHz signal component and the 38 kHz "sub-carrier" component, and thus there are obtained those signals which represent the average amplitudes of the time-shared L' and R' signals. In this way, there is formed a demodulator circuitry of the averaging detection type. Said filters 14a and 14b also has the function of performing de-emphasis for developing the final true L and R audio signals.

The two left and right outputs of the switching circuit 12 are also connected, via respective feedback resistors RfL and RfR, commonly to the input of the voltage amplifier circuit 11, and a series resistor Re is inserted between the input terminal IN and the input of the voltage amplifier 11, in order to effect negative feedback of the fractions of the output signals of the switching circuit 12.

Figure 4:
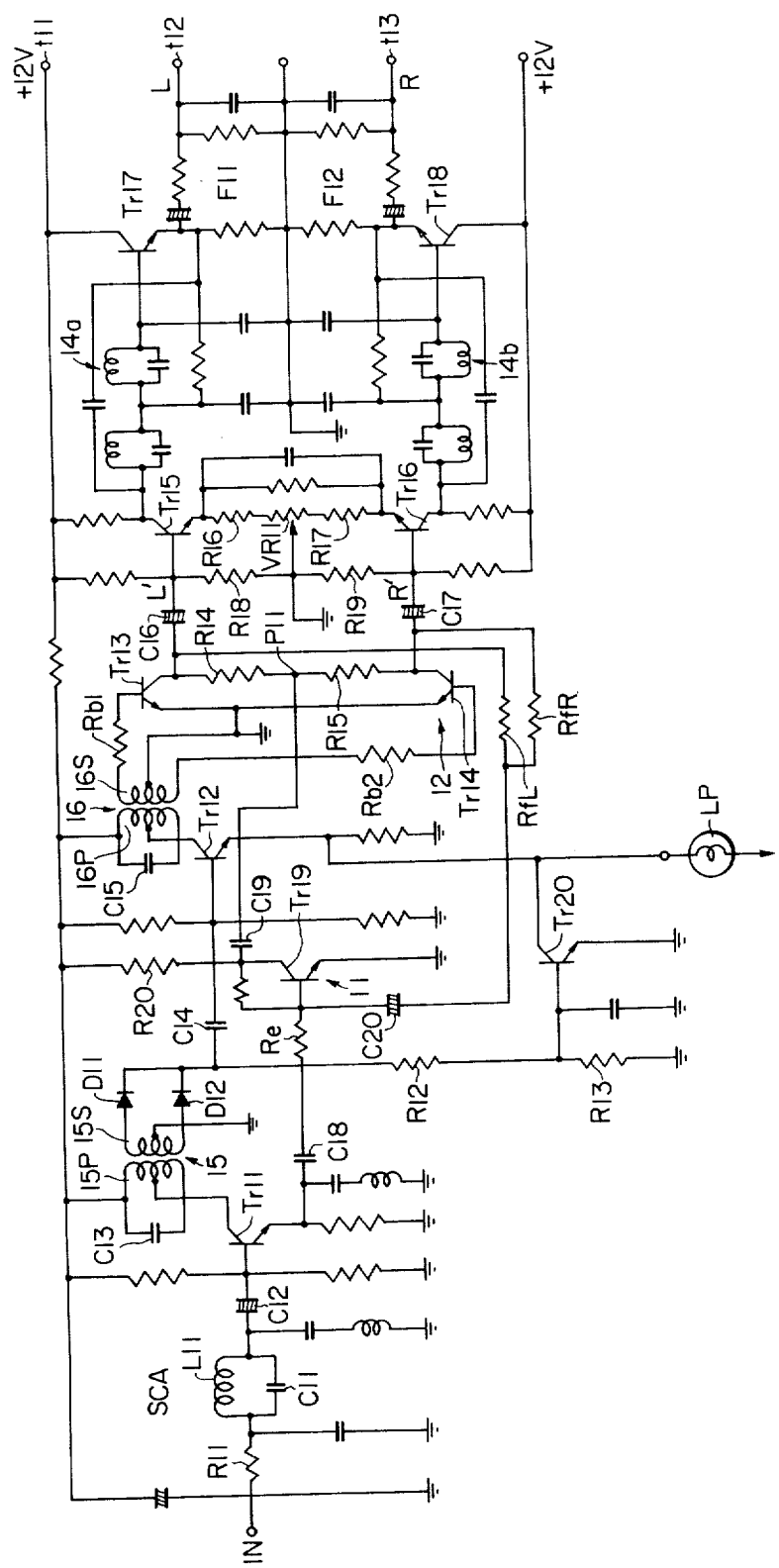
FIG. 4 is an electrical circuit diagram of an example of the averaging demodulator circuitry based on FIG. 3.

An example of circuit arrangement in conformity with the block diagram of FIG. 3 is illustrated in detail in FIG. 4. The input terminal IN as illustrated is connected to the base of a transistor Tr11 via a resistance R11, an SCA trap formed by a tank circuit composed of an inductance element L11 and a capacitor C11, and another capacitor C12. The collector of this transistor Tr11 is connected to the mid-point of the primary 15p of a coupling transformer 15, and a capacitor C13 is connected between both extremities of the primary 15p of a coupling transformer 15, and a capacitor C13 is connected between both extremities of the primary 15p. The connection between the capacitor C13 and one extremity of the primary 15p is further connected to a supply terminal t11.

Both extremities of the secondary 15s of the coupling transformer 15 are connected to the anodes of a pair of diodes D11 and D12 respectively. The cathodes of these diodes are, on the one hand, commonly grounded via resistors R12 and R13 and, on the other hand, connected to a capacitor C14. The secondary of the coupling transformer 15 and the diodes D11 and D12 constitute, in combination, a frequency doubler which functions to convert the 19 kHz pilot signal into a 38 kHz subcarrier.

The capacitor C14 is connected to the base of a transistor Tr12, the emitter of which is grounded via a resistor, and the collector of which is connected to the mid-point of the primary 16p of a coupling transformer 16. A capacitor C15 is connected between both extremities of the primary 16p to form a tank circuit, and the connection between the capacitor C15 and one of the extremities of the primary 16p is further connected to the supply terminal t11.

Both extremities of the secondary 16s of the coupling transformer 16 are connected via resistors Rb1 and Rb2 to the bases of switching transistors Tr13 and Tr14 respectively, which form the switching circuit 12 previously mentioned with reference to FIG. 3. The emitters of these switching transistors Tr13 and Tr14 are commonly grounded on the one hand and, on the other hand, are connected to the mid-point of the secondary 16s of the coupling transformer 16. The collectors of the switching transistors are interconnected at a point P11 via resistors R14 and R15 respectively, and are also connected via capacitors C16 and C17 to the bases of transistors Tr15 and Tr16 respectively that form buffer amplifiers.

The emitters of these transistors Tr15 and Tr16 are connected to both extremities of a variable resistor VR11 via resistors R16 and R17 respectively, while the bases thereof are connected to the tap of the variable resistor VR11 via resistors R18 and R19 respectively, the tap being grounded. The collectors of the transistors Tr15 and Tr16 are connected to the bases of transistors Tr17 and Tr18 via filter circuits 14a and 14b of a known type. Outputs from the transistors Tr17 and Tr18 are delivered via low-pass filters F11 and F12 of a known type to output terminals t12 and t13 respectively as the final true L and R audio signals.

The emitters of the aforementioned transistor Tr11 is connected to the base of a transistor Tr19 via a capacitor C18 and a resistor Re. This transistor Tr19, constituting a voltage amplifier 11 for the amplification of the incoming stereophonic composite signal, has its emitter grounded and its collector connected, on the one hand, to the supply terminal t11 via a resistance R20 and, on the other hand, to the point of junction P11 between the resistors R14 and R15 of the switching circuit 12 via capacitor C19. To the base of the transistor Tr19 there are connected the collectors of the switching transistors Tr13 and Tr14 of the switching circuit 12 via feedback resistors RfL and RfR, respectively, and via a common capacitor C20 to form a negative feedback circuit as will be described later in further detail.

The resistor R12, grounded via the resistor R13 as previously mentioned, is also connected to the base of a transistor Tr20, the emitter of which is grounded and the collector of which is connected, on the one hand, to a lamp LP to be lit up for indication of a stereophonic reception and, on the other hand, to the emitter of the transistor Tr12.

Hereinabove has been described the arrangement of an example of the demodulator circuit of the present invention. A mode of operation of this demodulator circuitry will hereunder be described with reference to FIGS. 4, 5 and 6. During the operation of the receiver for the reception of a stereophonic broadcast, the stereophonic composite signal supplied through the input terminal IN has its SCA signal content removed at the SCA trap formed by the tank circuit composed of the inductance element L11 and the capacitor C11, and the other constituents of the stereophonic composite signal are fed to the base of the transistor Tr11.

The 19 kHz pilot signal also contained in the stereophonic composite signal is fed to the frequency doubler comprising the secondary 15s of the coupling transformer 15 and the diodes D11 and D12 via the tuned tank circuit comprising the primary 15p of the same coupling transformer and the capacitor C13. In this manner, there is obtained the 38 kHz subcarrier. This subcarrier is delivered via the capacitor C14 to the base of the transistor Tr12, where it is amplified, and thence to the tank circuit composed of the primary 16p of the coupling transformer 16 and the capacitor C15. Through this coupling transformer 16, the subcarrier is supplied to the bases of the switching transistors Tr13 and Tr14 from both extremities of the secondary 16s via the resistors Rb1 and Rb2 respectively, so that these switching transistors are alternately turned on and off as the positive half-cycle of the subcarrier is impressed to their bases.

The remaining constituents of the aforesaid stereophonic composite signal are delivered from the emitter of the transistor Tr11 to the base of the amplifying transistor Tr19 via the capacitor C18 and the resistor Re, and the amplified composite signal is fed from the collector of the transistor Tr19 to the point P11 of the switching circuit 12 via the capacitor C19. In this manner, as the switching transistors are alternately rendered conductive as previously discussed, the signals being fed to the capacitor C16 (for the left hand channel) and the capacitor C17 (for the right hand channel) are alternately shunted to the ground, whilst the non-shunted signals constitute the separate time-shared L' and R' signals for stereophonic reproduction of the transmitted sound as represented by the incoming stereophonic composite signal. After being amplified by the respective transistors Tr15 and Tr16, these L' and R' signals are passed through the filter circuits 14a and 14b for being averaged thereat and therefrom they are fed to the bases of the transistors Tr17 and Tr18 respectively, thereby to be amplified again. Thus, the final true L and R audio signals shown by broken lines in FIG. 5 are yielded, via the low-pass filters F11 and F12, at the output terminals t12 and t13 respectively.

The fractions of the time-shared L' and R' signals as they are produced from the collectors of the switching transistors Tr13 and Tr14 are fed back to the base of the voltage amplifying transistor Tr19 via the respective feedback resistors RfL and RfR and the common capacitor C20. Since in this process the negative feedback loop is traced by the time-shared L' or R' signal for each half-cycle of the 38 kHz subcarrier, as may be understood from FIG. 5, interference occurs as a result of the time-shared negative feedback operation. The voltage amplification factor in that part of the circuit from the input terminal IN up to the outputs of the switching circuit 12 during the reception of a stereophonic broadcast, accordingly, can be defined as: Rf/Re, where Rf designates the value of each of the feedback resistors and Re designates the value of the input series resistors Re of the voltage amplifying transistor Tr19.

During the above described stereophonic reception, a fraction of the 38 kHz subcarrier output of the frequency doubler composed of the secondary of the coupling transformer 15 and the diodes D11 and D12 is impressed via the resistor R12 to the base of the transistor Tr20 to cause conduction therethrough, whereupon the lamp LP will be lit up to indicate the reception of the stereophonic broadcast.

On the other hand, during the reception of a monophonic broadcast, continuous signals having the same waveform are produced simultaneously (not alternately as in the above described case of the stereophonic reception) from both collectors of the switching transistors Tr13 and Tr14. Thus, two feedback signals of a same amplitude level are fed back at the same time from the two outputs L' and R' of the switching circuit 12 via the feedback resistors RfL and RfR, respectively, and these feedback signals are summed up into a negative feedback signal which is applied to the input of the amplifying transistor Tr19. Thus, the voltage amplification factor in that part of the circuit from the input terminal IN up to the outputs of the switching circuit 12 during the reception of a monophonic broadcast, accordingly, is defined as Rf/2Re. Hence, the amplification factor in said part of the circuit during the monophonic reception is one half of the amplification factor observed during the stereophonic reception which relies on the "averaging detection".

As discussed above, it is the ultimate purpose of the present invention to arrange a demodulator circuitry of the "averaging-detection type" so that the magnitude of the final true audio signals obtained in the reception of the monophonic broadcast take the same values as the values obtained from "averaging-detection" in the reception of a stereophonic broadcast. To this end, according to the present invention, there is provided a demodulator circuitry having parallel negative feedback loops as shown in FIG. 3 in place of having, in the prior art, a compensating transistor Tr9 before the switching circuit as illustrated in FIG 2. More specifically, there is provided parallel negative feedback loops between the outputs L' and R' of the switching circuit and the input of the voltage amplifier of the demodulator circuitry shown in FIG. 3 to institute such an operation that the voltage amplification factor observed between the signal input and the outputs of the switching circuit during the reception of a monophonic broadcast be substantially one half of the voltage amplification factor in the same part of circuitry during the reception of a stereophonic broadcast, whereby obtaining the result that the magnitude of the final true audio signal appearing at the outputs of the domodulator circuitry in the reception of a monophonic broadcast is of the same level as the magnitude of the final true audio signals appearing at said outputs obtained from averaging-detection in the reception of a stereophonic broadcast.

While the present invention has been shown and described hereinbefore in terms of a preferred embodiment thereof, it will be easy for those skilled in the art to devise various modifications, substitutions and changes. It is, therefore, appropriate that the appended claims be construed broadly and in a manner consistent with the fair meaning and proper scope of the invention as herein disclosed.

I claim:

1. In a receiver for the reception of multiplex stereophonic and monophonic programs in an FM broadcase band, a demodulator circuitry of the averaging detection type designed for performing averaging detection of a stereophonic composite signal or the amplified monophonic signal and for switching, during the stereophonic reception, the amplified stereophonic composite signal in response to a subcarrier signal regenerated from a pilot signal component contained in said stereophonic composite signal to extract, into the alternately time-shared form, the two left and right stereophonic signal components contained is said stereophonic composite signal on said two left and right output channels of this switching circuit, and for producing, during the monophonic reception, said monophonic signal simultaneously and continuously on said two output channesl of the switching circuit;

buffer circuits connected to said two output channels of the switching circuit, respectively;

filter circuits connected to the outputs of said buffer circuits, respectively, for averaging only during the reception of the stereophonic composite signal the two extracted stereophonic signal components thereby converting these signal components into two left and right continuous stereophonic audio signals;

means for defining two negative feedback paths leading from said two left and right output channels of the switching circuit to the intput of the voltage amplifier; and an input impedance element connected to the input of said voltage amplifier, whereby, during the reception of a stereophonic composite signal, the two left and right output signals of the switching circuit are alternately applied to said two negative feedback paths in a time-shared manner, and, during the reception of a monophonic signal, the continuous monophonic left and right signals appearing at the two output channels of the switching circuit are applied to said two negative feedback paths simultaneously and continuously, thereby the amplification factor observed between the input of said impedance element and the two outputs of said switching circuit at the time of the reception of the monophonic signal is substantially one half of the amplification factor observed at the time of the reception of the stereophonic composite signal, whereby the feedback impedance at the monaural reception is one half the feedback impedance at the stereophonic reception so that the monophonic audio signals appearing at the outputs of the two filter circuits have substantially the same amplitude levels as those of the left and right continuous stereophonic audio signals obtained through the averaging actions of the two filters.

2. A demodulator circuitry according to claim 1, in which: said means defining two negative feedback paths each includes a feedback resistor; and said impedance element is a resistor.

3. A demodulator circuitry according to claim 1, in which: said switching circuit is of the shunt type.

4. A demodulator circuitry according to claim 1, in which: said buffer circuits each includes an amplifier.

5. A demodulator circuitry according to claim 1, in which: said filter circuits each has two trap circuits for trapping by one of said trap circuits the pilot signal component and for trapping by the other trap circuit the subcarrier signal component.

6. A demodulator circuitry according to claim 1, in which said voltage amplifier comprises a transistor having an emitter which is grounded, a collector which is connected to said switching circuit and a base which is connected to a junction between said input impedance element and said two negative feedback paths.

7. A demodulator circuit as in claim 1, wherein the impedances of each of said paths is the same and the ratio of the total feedback impedance to the impedance of said input element during monaural reception is one half the ratio during stereophonic reception.

* * * * *